United States Patent [19]
Lee

[11] Patent Number: 5,689,396
[45] Date of Patent: Nov. 18, 1997

[54] SIGNAL INPUT UNIT FOR SEMICONDUCTOR MEMORY DEVICE

[75] Inventor: Jae Jin Lee, Kyoungki-do, Rep. of Korea

[73] Assignee: Hyundai Electronics Industries, Co., Ltd., Kyoungki-Do, Rep. of Korea

[21] Appl. No.: 559,605

[22] Filed: Nov. 20, 1995

[30] Foreign Application Priority Data

Nov. 21, 1994 [KR] Rep. of Korea .................. 94-30633

[51] Int. Cl.$^6$ ........................................... H02H 9/00
[52] U.S. Cl. .......................... 361/111; 361/56; 361/58; 361/119
[58] Field of Search ........................ 361/56, 91, 111, 361/118, 119, 58

[56] References Cited

U.S. PATENT DOCUMENTS 4,147,990  4/1979  Dokus ............................. 330/11

Primary Examiner—Jeffrey A. Gaffin
Assistant Examiner—Stephen Jackson
Attorney, Agent, or Firm—Morgan & Finnegan LLP

[57] ABSTRACT

A signal input unit for a semiconductor memory device comprising a signal input terminal, an electrostatic discharge protection circuit for discharging an electrostatic signal of high level from the input terminal to a ground voltage source, a signal transfer circuit connected in parallel to the electrostatic discharge protection circuit, for switching a normal input signal from the input terminal, a signal transfer control circuit for controlling a switching operation of the signal transfer circuit, and a signal input circuit for buffering an output signal from the electrostatic discharge protection circuit or the signal transfer circuit and transferring the buffered signal to an internal circuit of the semiconductor memory device. The electrostatic discharge protection circuit sufficiently discharges the external electrostatic signal to the ground voltage source in a standby mode of the semiconductor memory device. The signal transfer circuit is connected in parallel to the electrostatic discharge protection circuit so that the normal input signal can be transferred directly to the signal input circuit in an operation mode of the semiconductor memory device with no delay by the electrostatic discharge protection circuit. Therefore, a signal delay can be prevented.

10 Claims, 4 Drawing Sheets

SIGNAL INPUT UNIT FOR SEMICONDUCTOR MEMORY DEVICE

BACKGROUND OF THE INVENTION

1. Field of the Invention

The present invention relates in general to signal input units for semiconductor memory devices, and more particularly to a signal input unit for a semiconductor memory device which is capable of preventing the semiconductor memory device from being subjected to damage due to an external electrostatic signal which may be inputted thereto in a standby state and of minimizing the delay of an external normal input signal inputted to the semiconductor memory device in an operating state.

2. Description of the Prior Art

Generally, a semiconductor memory device is subjected to damage due to static electricity when it is independently present. For example, the semiconductor memory device may come into contact with a human body or an object with static electricity while it is transported or manufactured. In this case, the static electricity is inputted to the semiconductor memory device through its pins, thereby causing a high electric field to be applied to gate oxides of MOS transistors constituting the semiconductor memory device. Such a high electric field results in serious damage to the gate oxides of the MOS transistors and, thus, a faulty operation of the semiconductor memory device.

In order to prevent such a problem, an electrostatic discharge (referred to hereinafter as ESD) protection circuit is usually provided at an input stage of the semiconductor memory device. The ESD protection circuit acts to rapidly discharge the inputted static electricity to a ground line.

On the other hand, a high voltage signal cannot be infiltrated into the input stage of the semiconductor memory device during the operation thereof because the static electricity is discharged to the ground line before it is inputted to the semiconductor memory device. As a result, the above problem does not occur during the operation of the semiconductor memory device.

Referring to FIG. 1, there is shown a circuit diagram of a conventional signal input unit for a semiconductor memory device. As shown in this drawing, the conventional signal input unit comprises a signal input terminal in, an ESD protection circuit 101 for discharging an external signal, such as an electrostatic signal, inputted at the input terminal in to a ground voltage source Vss, and a signal input circuit 102 for buffering an output signal from the ESD protection circuit 101 and transferring the buffered signal to an internal circuit of the semiconductor memory device.

The ESD protection circuit 101 acts to prevent gate oxides of the semiconductor memory device from being subjected to damage due to a voltage inputted to external pins of the semiconductor memory device when they come into contact with a human body or an object with static electricity.

In the case where the external signal such as the electrostatic signal is inputted at the input terminal in, it is not transferred directly to the signal input circuit 102 but through the ESD protection circuit 101 to the ground voltage source vss. To this end, the ESD protection circuit 101 includes an NMOS transistor Q1, a PMOS transistor Q2 and a resistor R1. Namely, the external electrostatic signal inputted from the input terminal in is transferred to a node N1 and then branches off to the NMOS transistor Q1 and the resistor R1. The NMOS transistor Q1 has its gate connected to its drain. In this connection, the NMOS transistor Q1 has a diode structure for discharging a current from the node N1 to the ground voltage source Vss. The resistor R1 acts as a delay element for allowing a portion of the electrostatic signal, not discharged by the NMOS transistor Q1, not to be transferred to the internal circuit of the semiconductor memory device. A signal delayed by the resistor R1 is discharged to the ground voltage source Vss by the PMOS transistor Q2. The signal input circuit 102 acts to buffer the output signal from the ESD protection circuit 101 and to transfer the buffered signal to the internal circuit of the semiconductor memory device. To this end, the signal input circuit 102 includes a PMOS transistor Q3 and an NMOS transistor Q4 connected in series between a supply voltage source Vdd and the ground voltage source Vss.

The above-mentioned conventional signal input unit can discharge the electrostatic signal to the ground voltage source by delaying it for a long time. However, the conventional signal input unit has a disadvantage in that it delays even an external normal input signal inputted to the semiconductor memory device in a normal operation state, resulting in a reduction in the operating speed of the semiconductor memory device.

SUMMARY OF THE INVENTION

Therefore, the present invention has been made in view of the above problem, and it is an object of the present invention to provide a signal input unit for a semiconductor memory device which is capable of sufficiently discharging an external electrostatic signal to a ground voltage source in a standby mode and of minimizing the delay of an external normal input signal inputted to the semiconductor memory device in an operation mode.

In accordance with the present invention, the above and other objects can be accomplished by a provision of a signal input unit for a semiconductor memory device comprising a signal input terminal; electrostatic discharge protection means for discharging an electrostatic signal of high level from the input terminal to a ground voltage source; signal transfer means connected in parallel to the electrostatic discharge protection means, for switching a normal input signal from the input terminal; signal transfer control means for controlling a switching operation of the signal transfer means; and signal input means for buffering an output signal from the electrostatic discharge protection means or the signal transfer means and transferring the buffered signal to an internal circuit of the semiconductor memory device.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
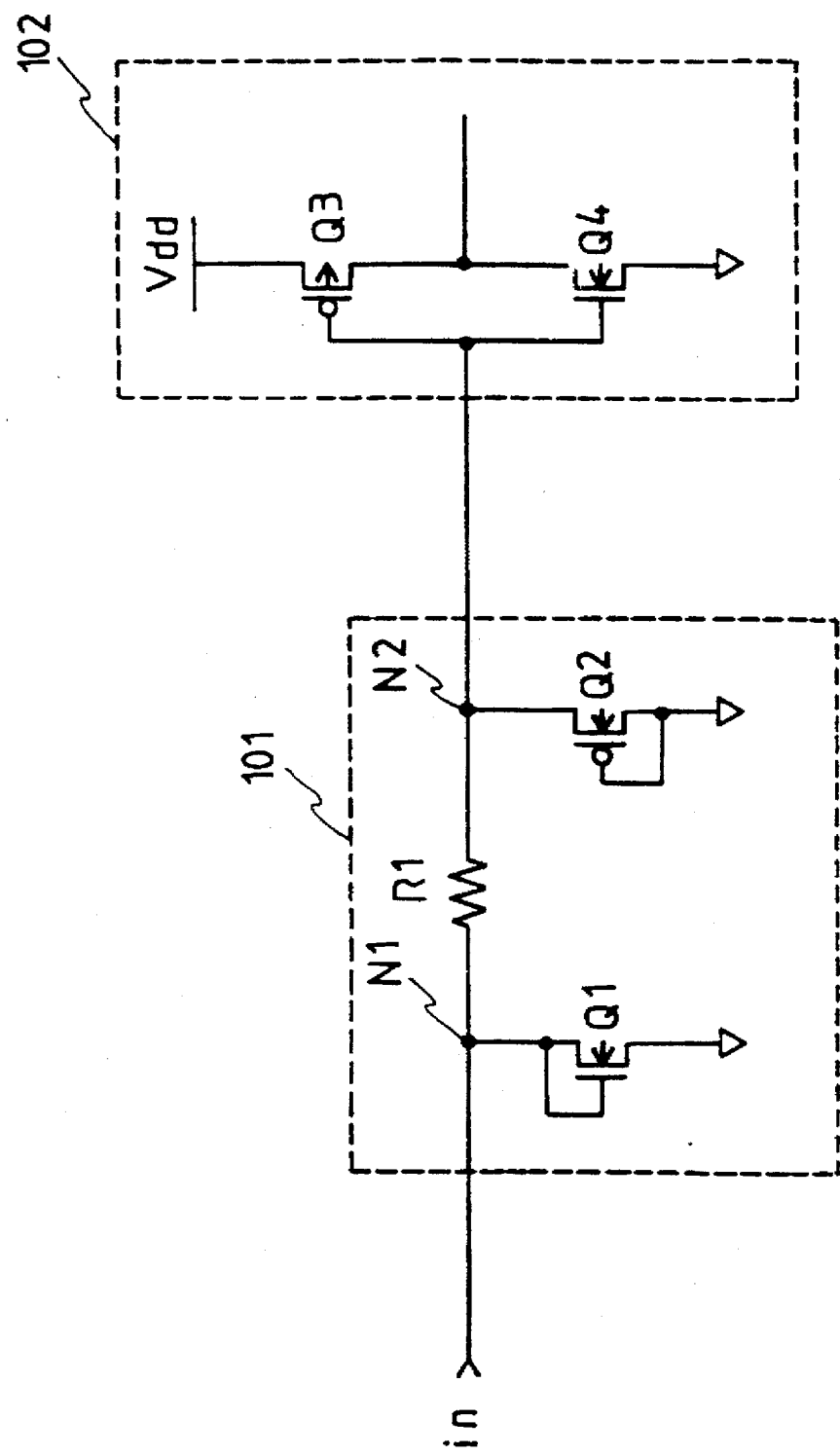
FIG. 1 is a circuit diagram of a conventional signal input unit for a semiconductor memory device.
Figure 2:
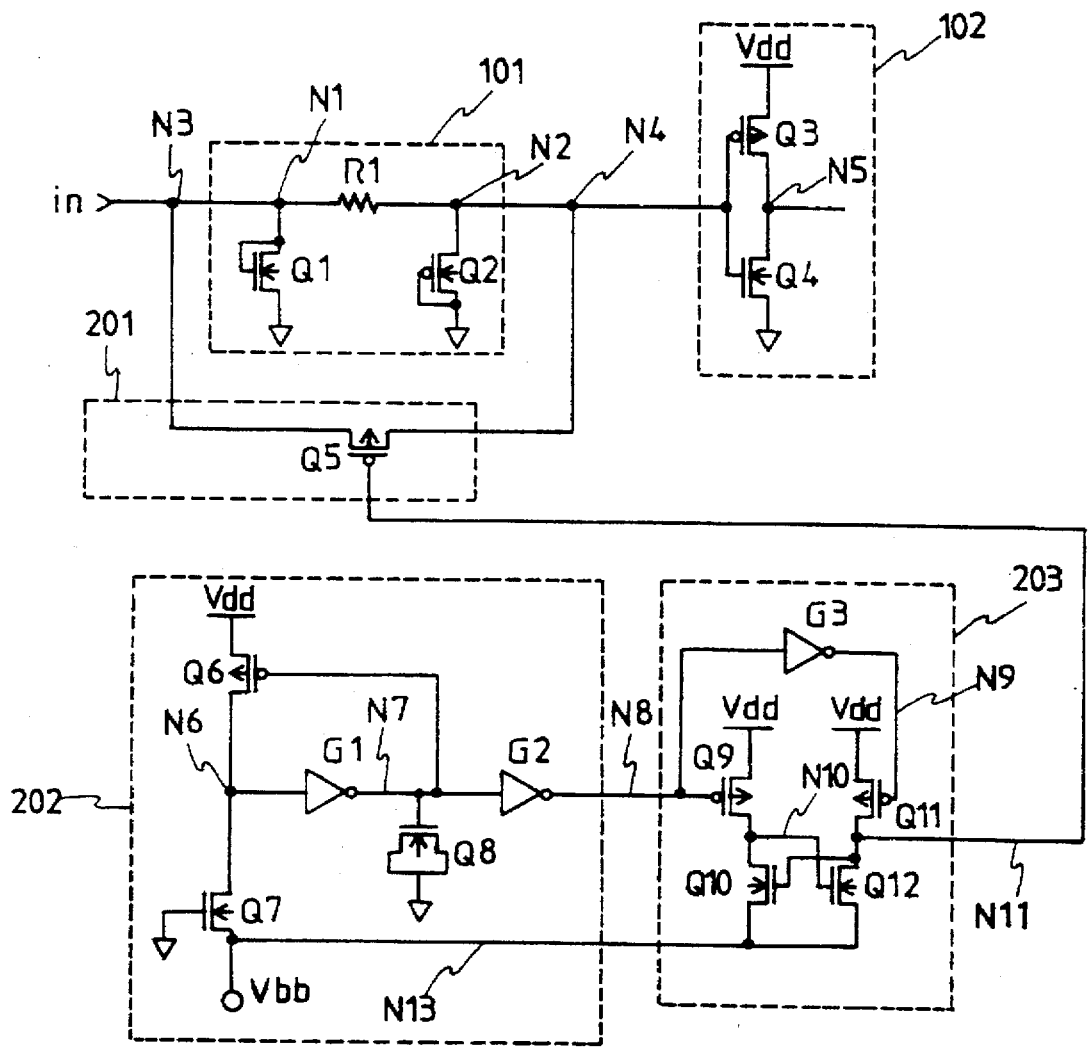
FIG. 2 is a circuit diagram of a signal input unit for a semiconductor memory device in accordance with an embodiment of the present invention.

Referring to FIG. 2, there is shown a circuit diagram of a signal input unit for a semiconductor memory device in accordance with an embodiment of the present invention. Some parts in this drawing are the same as those in FIG. 1. Therefore, like reference numerals designate like parts.

As shown in FIG. 2, the signal input unit comprises a signal transfer circuit 201 and a signal transfer control circuit in addition to the ESD protection circuit 101 and the signal input circuit 102 in FIG. 1. The ESD protection circuit 101 acts to discharge the electrostatic signal of high level inputted at the input terminal in to the ground voltage source Vss. To this end, the ESD protection circuit 101 includes the NMOS transistor Q1, the PMOS transistor Q2 and the resistor R1.

The signal transfer circuit 201 is connected in parallel to the ESD protection circuit 101 to switch a normal input signal from the input terminal in to the signal input circuit 102. To this end, the signal transfer circuit 201 includes a PMOS transistor Q5 connected between nodes N3 and N4.

The signal input circuit 102 acts to buffer an output signal from the ESD protection circuit 101 or the signal transfer circuit 201 and to transfer the buffered signal to the internal circuit of the semiconductor memory device. To this end, the signal input circuit 102 includes the PMOS transistor Q3 and the NMOS transistor Q4 connected in series between the supply voltage source Vdd and the ground voltage source Vss.

The signal transfer control circuit acts to control a switching operation of the signal transfer circuit 201. To this end, the signal transfer control circuit includes a supply voltage sensing circuit 202 for sensing the application of a supply voltage from the supply voltage source vdd to the semiconductor memory device, and a voltage conversion circuit 203 for level-shifting an output signal from the supply voltage sensing circuit 202 and supplying the resultant signal to a gate of the PMOS transistor Q5 in the signal transfer circuit 201.

In accordance with the preferred embodiment of the present invention, the signal transfer circuit 201 has a delay time shorter than that of the delay element or the resistor R1 in the ESD protection circuit 101. In this connection, in a normal operation state, an external input signal from the input terminal in is transferred to the signal input circuit 102 through the signal transfer circuit 201 rather than the ESD protection circuit 101. That is, the external input signal is rapidly transferred to the signal input circuit 102. AS a result, the semiconductor memory device is enhanced in its operating speed.

The operation of the signal input unit for the semiconductor memory device with the above-mentioned construction in accordance with the embodiment of the present invention will hereinafter be described in detail with reference to FIG. 2.

First, in the case where the electrostatic signal of plus level is inputted at the input terminal in, it is discharged to the ground voltage source Vss through the NMOS and PMOS transistors Q1 and Q2 in the ESD protection circuit 101.

The supply voltage sensing circuit 202 functions to sense the application of the supply voltage from the supply voltage source Vdd to the semiconductor memory device. To this end, the supply voltage sensing circuit 202 includes a PMOS transistor Q6 connected between the supply voltage source Vdd and a node N6, an NMOS transistor Q7 connected between the node N6 and a node N13, an inverter G1 connected between the node N6 and a node N7, and an inverter G2 connected between the node N7 and a node N8. The PMOS transistor 06 has its gate connected to the node N7 and the NMOS transistor Q7 has its gate connected no the ground voltage source Vss. The supply voltage sensing circuit 202 further includes an NMOS transistor Q8 having its gate connected to the node N7 and its drain and source connected in common To the ground voltage source Vss.

When the supply voltage from the supply voltage source Vdd is applied to the semiconductor memory device, a ground voltage from the ground voltage source Vss is maintained at the node N7 for a predetermined time period by the NMOS transistor Q8. The ground voltage at the node N7 is applied to the gate of the PMOS transistor Q6, thereby causing the PMOS transistor Q6 to be turned on. As the PMOS transistor Q6 is turned on, the node N6 goes high in logic. Also, the nodes N7 and N8 become low and high in logic by means of the inverters G1 and G2, respectively.

At this time, a substrate voltage from a substrate voltage source Vbb is still not applied to a source of the NMOS transistor Q7. As a result, the NMOS transistor Q7 remains at its OFF state.

The voltage conversion circuit 203 functions to level-shift the output signal from the supply voltage sensing circuit 202 and to supply the resultant signal to the gate of the PMOS transistor Q5 in the signal transfer circuit 201. To this end, the voltage conversion circuit 203 includes a PMOS transistor Q9 connected between the supply voltage source Vdd and a node N10, an NMOS transistor Q10 connected between the nodes N10 and N13, a PMOS transistor Q11 connected between the supply voltage source Vdd and a node N11, an inverter G3 connected between the node N8 and a node N9, and an NMOS transistor Q12 connected between the nodes N11 and N13. The PMOS transistor Q9 has its gate connected to the node N8, the NMOS transistor Q10 has its gate connected to the node N11, the PMOS transistor Q11 has its gate connected to the node N9, and the NMOS transistor Q12 has its gate connected to the node N10.

When the node N8 is high in logic, the PMOS transistor Q9 is turned off, whereas the PMOS transistor Q11 is turned on. As a result, the node N11 goes high in logic, thereby causing the NMOS transistor Q10 to be turned on. As the NMOS transistor Q10 is turned on, the node N10 becomes low in logic because of the substrate voltage Vbb.

In the case where the substrate voltage Vbb becomes lower by a threshold voltage Vt of the NMOS transistor Q7 than the ground voltage vss when a predetermined time period has elapsed since the supply voltage from the supply voltage source Vdd was applied to the semiconductor memory device, the NMOS transistor Q7 is turned on, thereby causing the substrate voltage Vbb to become still lower. When the substrate voltage Vbb supplied by the NMOS transistor Q7 becomes higher than the high voltage supplied by the PMOS transistor Q6, the node N6 goes low in logic. As a result, the node N7 goes high in logic, whereas the node N8 goes low in logic.

Because the node N8 is low in logic, the PMOS transistor Q9 is turned on, whereas the PMOS transistor Q11 is turned off. As a result, the node N10 goes high in logic, thereby causing the NMOS transistor Q12 to be turned on. AS the NMOS transistor Q12 is turned on, an output node or the node N11 becomes low in logic. The low logic signal at the node N11 is applied to the gate of the PMOS transistor Q5 in the signal transfer circuit 201, so as to turn the PMOS transistor Q5 on. AS the PMOS transistor Q5 is turned on, the external input signal from the input terminal in is transferred to the signal input circuit 102.

Figure 3:
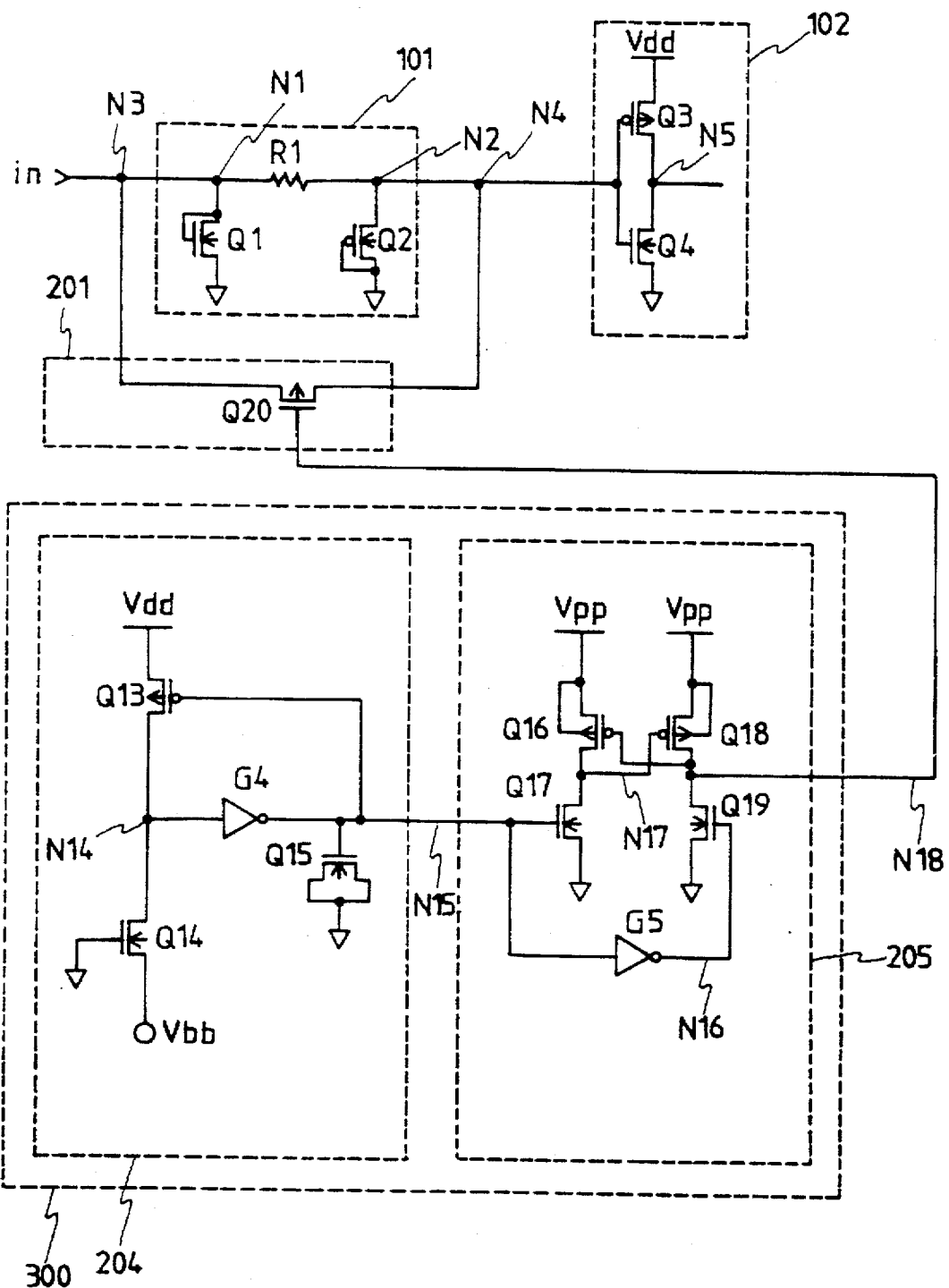
FIG. 3 is a circuit diagram of a signal input unit for a semiconductor memory device in accordance with an alternative embodiment of the present invention.

Referring to FIG. 3, there is shown a circuit diagram of a signal input unit for a semiconductor memory device in accordance with an alternative embodiment of the present invention. Some parts in this drawing are the same as those in FIG. 2. Therefore, like reference numerals designate like parts.

As shown in FIG. 3, the signal input unit comprises the ESD protection circuit 101, the signal input circuit 102, the signal transfer circuit 201 and the signal transfer control circuit.

The ESD protection circuit 101 acts to discharge the electrostatic signal of high level inputted at the input terminal in to the ground voltage source Vss. To this end, the ESD protection circuit 101 includes the NMOS and PMOS transistors Q1 and Q2 and the resistor R1.

The signal transfer circuit 201 is connected in parallel to the ESD protection circuit 101 to switch the normal input signal from the input terminal in to the signal input circuit 102. To this end, the signal transfer circuit 201 includes the PMOS transistor Q5 connected between the nodes N3 and N4.

The signal input circuit 102 acts to buffer the output signal from the ESD protection circuit 101 or the signal transfer circuit 201 and to transfer the buffered signal to the internal circuit of the semiconductor memory device. To this end, the signal input circuit 102 includes the PMOS transistor Q3 and the NMOS transistor Q4 connected in series between the supply voltage source Vdd and the ground voltage source Vss.

The signal transfer control circuit acts to control the switching operation of the signal transfer circuit 201. To this end, the signal transfer control circuit includes a supply voltage sensing circuit 204 for sensing the application of the supply voltage from the supply voltage source Vdd to the semiconductor memory device, and a voltage conversion circuit 205 for level-shifting an output signal from The supply voltage sensing circuit 204 and supplying the resultant signal to the signal transfer circuit 201.

The supply voltage sensing circuit 204 includes a PMOS transistor Q13 connected between the supply voltage source Vdd and a node N14, an NMOS transistor Q14 connected between the node and the substrate voltage source Vbb, and an inverter G4 connected between the node N14 and a node N15. The PMOS transistor Q13 has its gate connected to the node N15 and the NMOS transistor Q14 has its gate connected to the ground voltage source Vss. The supply voltage sensing circuit 204 further includes an NMOS transistor Q15 having its gate connected to the node N15 and its drain and source connected in common to the ground voltage source Vss.

The voltage conversion circuit 205 includes a PMOS transistor Q16 connected between the supply voltage source Vdd and a node N17, an NMOS transistor Q17 connected between the node N17 and the ground voltage source Vss, a PMOS transistor Q18 connected between the supply voltage source Vdd and a node N18, an NMOS transistor Q19 connected between the node N18 and the ground voltage source Vss, and an inverter G5 connected between the node N15 and a node N16. The PMOS transistor Q16 has its gate connected to the node N18, the NMOS transistor Q17 has its gate connected to the node N15, the PMOS transistor Q18 has its gate connected to the node N17, and the NMOS transistor Q19 has its gate connected to the node N16.

The signal transfer circuit 201 includes an NMOS transistor Q20 having its gate connected to an output node or the node N18 of the voltage conversion circuit 205.

The operation of the signal input unit for the semiconductor memory device with the above-mentioned construction in accordance with the alternative embodiment of the present invention will hereinafter be described in detail with reference to FIG. 3.

When the supply voltage from the supply voltage source Vdd is applied to the semiconductor memory device, the ground voltage from the ground voltage source Vss is maintained at the node N15 for, a predetermined time period by the NMOS transistor Q15. The ground voltage at the node N15 is applied to the gate of the PMOS transistor Q13, thereby causing the PMOS transistor Q13 to be turned on. AS the PMOS transistor Q13 is turned on, the node N14 goes high in logic. Also, the node N15 becomes low in logic by means of the inverter G4.

At this time, the substrate voltage Vbb is still not applied to a source of the NMOS transistor Q14. As a result, the NMOS transistor Q14 remains at its OFF state.

When the node N15 is low in logic, the NMOS transistor Q17 is turned off, whereas the NMOS transistor Q19 is turned on. As a result, the node N18 goes low in logic, thereby causing the PMOS transistor Q16 to be turned on. The low logic signal at the node N18 is applied to the gate of the NMOS transistor Q20 in the signal transfer circuit 201, so as to turn the NMOS transistor Q20 off.

In the case where the substrate voltage Vbb applied to the source of the NMOS transistor Q14 becomes lower by a threshold voltage Vt of the NMOS transistor Q14 than the ground voltage Vss when a predetermined time period has elapsed since the supply voltage from the supply voltage source vdd was applied to the semiconductor memory device, the NMOS transistor Q14 is turned on thereby causing the substrate voltage Vbb to become still lower. When the substrate voltage Vbb supplied by the NMOS transistor 014 becomes higher than the high voltage supplied by the PMOS transistor Q13, the node N14 goes low in logic. As a result, the node N15 goes high in logic.

Because the node N15 is high in logic, the NMOS transistor Q17 is turned on, whereas the NMOS transistor Q19 is turned off. As a result, the node N17 goes low in logic, thereby causing the PMOS transistor Q18 to be turned on. As the PMOS transistor Q18 is turned on, the output node N18 has a high level voltage Vpp. The high level signal at the node N18 is applied to the gate of the NMOS transistor Q20 in the signal transfer circuit 201, so as to turn the NMOS transistor Q20 on. As the NMOS transistor Q20 is turned on, the external input signal from the input terminal in is transferred to the signal input circuit 102.

Figure 4:
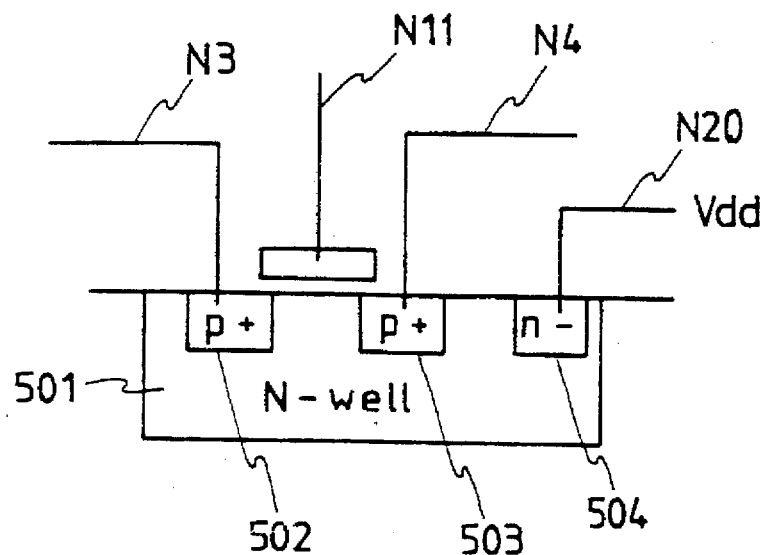
FIG. 4 is a sectional view of a PMOS transistor in a signal transfer circuit in FIG. 2.

Referring to FIG. 4, there is shown a sectional view of the PMOS transistor Q5 in the signal transfer circuit 201 in FIG. 2. When the low logic signal from the node N11 is applied to the gate, a pn-junction diode structure is formed between a source region 502, which receives the input signal from the input terminal in, and an n-well 501. With the pn-junction diode structure formed, the plus static electricity from the input terminal in is discharged to a node N20 through an n-well bias region 504. The supply voltage source Vdd is also connected to the node N20 to apply a reverse bias voltage to the n-well bias region 504.

Figure 5:
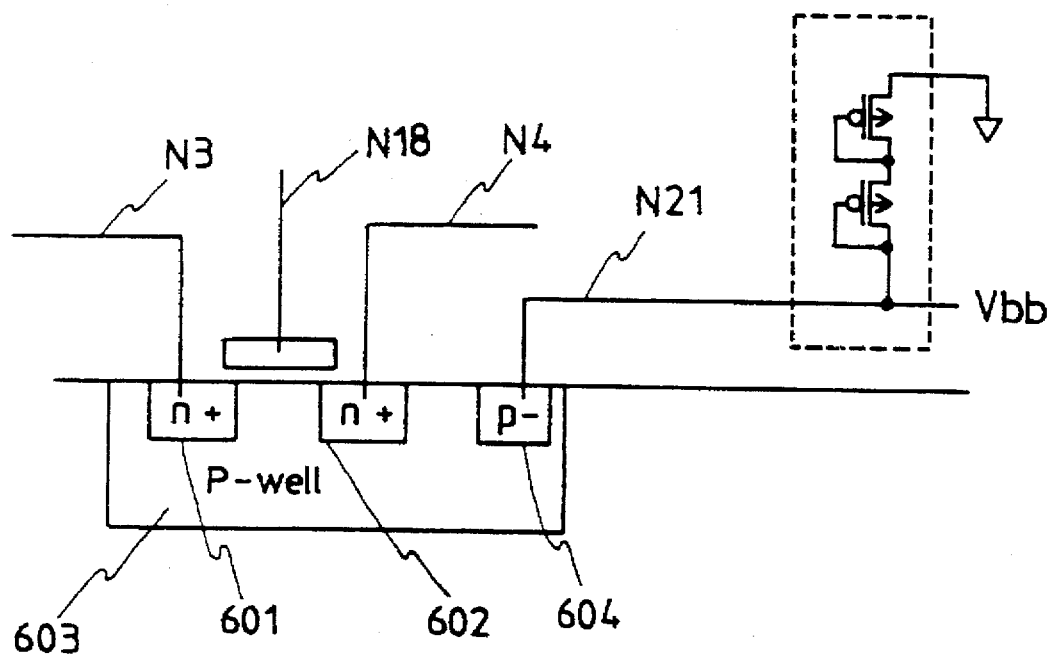
FIG. 5 is a sectional view of an NMOS transistor in a signal transfer circuit in FIG. 3.

Referring to FIG. 5, there is shown a sectional view of the NMOS transistor Q20 in the signal transfer circuit 201 in FIG. 3. When the high logic signal from the node N18 is applied to the gate, a pn-junction diode structure is formed between a source region 601, which receives the input signal from the input terminal in, and a p-well 603. With the pn-junction diode structure formed, the plus static electricity from the input terminal in is discharged to a node N21 through a p-well bias region 604. For example, in a semiconductor memory device such as a dynamic random access memory (DRAM), the substrate voltage source Vbb or the ground voltage source Vss may be connected to the node N21 to apply a reverse bias voltage to the p-well bias region 604. Alternatively, a PMOS diode structure connected to the ground voltage source Vss may be coupled to the substrate voltage source Vbb connected to the p-well bias region 604.

As apparent from the adore description, according to the present invention, the ESD protection circuit can sufficiently discharge the external electrostatic signal to the ground voltage source in the standby mode of the semiconductor memory device. The signal transfer circuit is connected in parallel to the ESD protection circuit so that the normal input signal can be transferred directly to the signal input circuit in the operation mode of the semiconductor memory device with no delay by the ESD protection circuit. Therefore, the signal input unit of the present invention has the effect of preventing a signal delay.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A signal input unit for a semiconductor memory device comprising:

a signal input terminal;

electrostatic discharge protection means for discharging an electrostatic signal of high level from said input terminal to a ground voltage source;

signal transfer means connected in parallel to said electrostatic discharge protection means, for switching a normal input signal from said input terminal;

signal transfer control means for controlling a switching operation of said signal transfer means, said signal transfer control means including supply voltage sensing means for sensing the application of a supply voltage from a supply voltage source to the semiconductor memory device and voltage conversion means for level-shifting an output signal from said supply voltage sensing means and supplying the resultant signal to said signal transfer means; and signal input means for buffering an output signal from said electrostatic discharge protection means or said signal transfer means and transferring the buffered signal to an internal circuit of the semiconductor memory device.

2. A signal input unit for a semiconductor memory device as set forth in claim 1, wherein said supply voltage sensing means is adapted to sense the application of the supply voltage and a substrate voltage to the semiconductor memory device.

3. A signal input unit for a semiconductor memory device as set forth in claim 2, wherein said signal transfer control means is adapted to apply the substrate voltage to said signal transfer means when the substrate voltage is lower than a ground voltage and to apply the supply voltage to said signal transfer means when the substrate voltage is higher than the ground voltage.

4. A signal input unit for a semiconductor memory device as set forth in claim 1, wherein said voltage conversion means is adapted to supply a low level signal to said signal transfer means before the supply voltage is applied to the semiconductor memory device and to supply a high level signal to said signal transfer means when a predetermined time period has elapsed since the supply voltage was applied to the semiconductor memory device.

5. A signal input unit for a semiconductor memory device as set forth in claim 4, wherein said signal transfer means remains at its off state before the supply voltage is applied to the semiconductor memory device and is turned on when the predetermined time period has elapsed since the supply voltage was applied to the semiconductor memory device.

6. A signal input unit for a semiconductor memory device as set forth in claim 1, wherein said signal transfer means includes a PMOS transistor.

7. A signal input unit for a semiconductor memory device as set forth in claim 6, wherein said PMOS transistor includes an n-well bias region connected to the supply voltage source, for receiving a reverse bias voltage therefrom.

8. A signal input unit for a semiconductor memory device as set forth in claim 1, wherein said signal transfer means includes an NMOS transistor.

9. A signal input unit for a semiconductor memory device as set forth in claim 8, wherein said NMOS transistor includes a p-well bias region connected to the ground voltage source or a substrate voltage source.

10. A signal input unit for a semiconductor memory device as set forth in claim 8, wherein said NMOS transistor includes a p-well bias region connected to a substrate voltage source, said substrate voltage source being connected to a PMOS diode structure, said PMOS diode structure being connected in series to the ground voltage source.

\* \* \* \* \*